United States Patent

[11] 3,609,573

[72] Inventor Hugh A. Hair
Liverpool, N.Y.
[21] Appl. No. 827,832
[22] Filed May 26, 1969
[45] Patented Sept. 28, 1971
[73] Assignee Anaren Microwave Incorporated
Syracuse, N.Y.

[54] BALANCED AMPLIFIER
6 Claims, 3 Drawing Figs.

[52] U.S. Cl. .......... 330/38 M, 330/16
[51] Int. Cl. .......... H03f 3/14
[50] Field of Search .......... 330/38 M, 53

[56] References Cited

UNITED STATES PATENTS

| | | | |
|---|---|---|---|
| 3,263,178 | 7/1966 | Nowalk | 330/38 X |
| 3,393,328 | 7/1968 | Meadows et al. | 330/38 X |
| 3,423,688 | 1/1969 | Seidel | 330/53 |
| 3,426,292 | 2/1969 | Seidel | 330/53 X |
| 3,444,475 | 5/1969 | Seidel | 330/53 |

*Primary Examiner*—Nathan Kaufman
*Attorney*—Camil P. Spiecens

ABSTRACT: A balanced transistor amplifier is disposed on a slab of electrically and thermally conductive material. Two transistors are fixed in thermal contact with the slab. A 3 db. quadrature coupler feeds a signal from a common input to both transistors. A second 3 db. quadrature coupler feeds the amplified signals from both transistors to a common output.

PATENTED SEP 28 1971 3,609,573

INVENTOR.
Hugh A. Hair

BY

ATTORNEY

BALANCED AMPLIFIER

This invention pertains to signal amplifiers and more particularly to signal amplifiers using a plurality of amplifying devices operating in parallel.

In many communication devices such as transceivers, for example, the required power gain is such as to demand more power than a single amplifying device can economically deliver. This situation can occur when the amplifying devices are solid-state devices such as transistors. The immediate solution is to use a plurality of devices in parallel. However, at higher frequencies, reflection and matching problems can arise which leads to unreliable and noisy operation of the amplifier. Furthermore, a high-power levels provision must be made to dissipate the heat generated by the amplifying devices.

It is accordingly a general object of the invention to provide an improved signal amplifier.

It is another object of the invention to provide an improved signal amplifier which utilizes inexpensive amplifying devices at high power levels.

Other objects, the features and advantages of the invention will be apparent from the following detailed description when read with the accompanying drawing which shows a signal amplifier in accordance with the invention.

Figure 1:
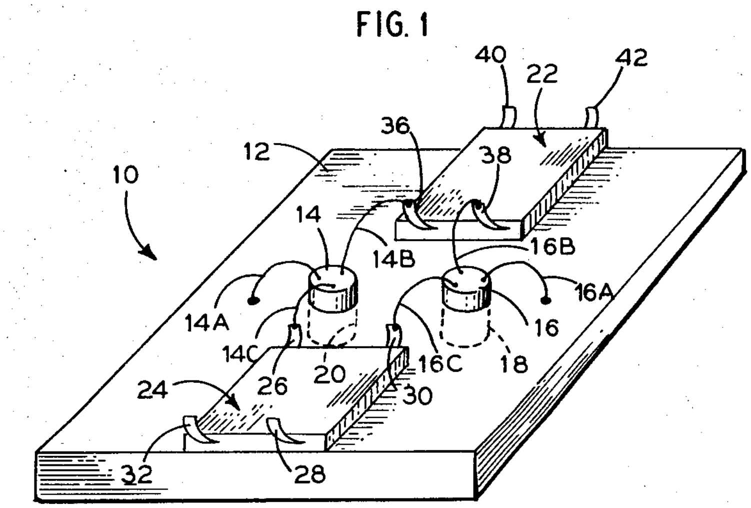
FIG. 1 shows a perspective view of an AC signal amplifier in accordance with the invention utilizing couplers to feed the amplifying devices.

The AC signal amplifier 10, shown in FIG. 1 comprises a slab 12 of thermally and electrically conductive material, a pair of like transistors signal amplifying devices 14 and 16 and a pair of like couplers 22 and 24.

The transistors 14 and 16 are provided with metal housings and are matingly fitted in cavities 20 and 18, respectively, in slab 12 to provide good thermal conduction from the solid state material within the transistor to the slab 12. Extending from transistor 14 are the leads 14A, 14B and 14C which can be connected to the emitter, collector and base terminals respectively, of the transistor. Similarly for transistor 16.

Couplers 20 and 22 are preferrably 3 db. quadrature couplers. Since the couplers are identical only coupler 20 will be described in detail. Coupler 20 is a four-port bidirectional device, wherein the power of a signal received at one port on one end of the device is equally split and transmitted from both ports at the other end of the device with the fourth port receiving no power. In addition, the signals transmitted from the two ports are in phase quadrature. Furthermore, if substantially equiamplitude signals in phase quadrature are fed to the two ports at one end of the coupler, all power exits from only one of the ports at the other end of the coupler.

In spite of the bidirectional properties of the couplers ports 32 and 28 will be considered as input ports and ports 26 and 30 output ports of coupler 24 (the input coupler), and ports 36 and 38 are input ports and ports 40 and 42 output ports of coupler 22 (the output coupler). Output port 26 is connected, via lead 14C, to the base electrode of transistor 14, and output port 30 is connected, via lead 16C, to the base electrode of transistor 16. Input port 36, is connected, via lead 14B, to the collector electrode of transistor 14 and input port 38 is connected, via lead 16B, to the collector electrode of transistor 16. (The emitter electrodes of the transistors are grounded to slab 12 via leads 14*a* and 16*a*). Operating voltages can be applied to the transistors via decoupling networks (not shown) connected to the base and collector electrodes of the transistors. Input port 32 of coupler 24 receives the input signal while import port 28 thereof can be terminated with a matching resistor (not shown). Output port 42 of coupler 22 transmits the output signals while output port 40 can be terminated with a matching resistor (not shown).

When a signal is applied to input port 32 it splits and is fed to output ports 26 and 30 in phase quadrature. These signals are amplified by transistors 14 and 16 and fed still in phase quadrature to input ports 36 and 38, respectively, of coupler 22 where they are combined and transmitted only to output port 42 thereof. It should be noted that if the base electrodes of the transistors reflect portions of the signals back to ports 26 and 30, they are focused back to only port 28 and dissipated by the terminating resistor.

Figure 2:
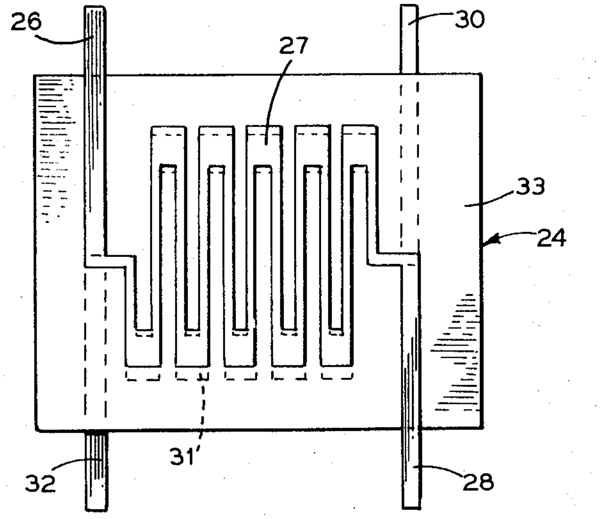
FIG. 2 shows the signal conductors of one of the couplers of FIG. 1.
Figure 3:
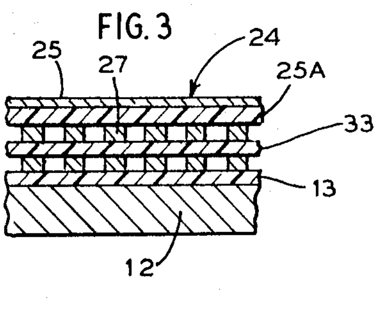
FIG. 3 is an enlarged cross-sectional view of a portion of one of the couplers of FIG. 1.

The details of coupler 24 will now be described with reference to FIGS. 2 and 3. Coupler 24 is preferrably of the stripline type comprising a top ground plane element 25 of electrically conductive material coplanar with slab 12 which provides the required bottom ground plane element. Fixed to the inner surface of ground plane element 25 is a sheet 25A of dielectric material. Another sheet 13 of dielectric material is fixed to slab 12 in the region of coupler 24. Sandwiched between sheets 25A and 13 and parallel thereto is another sheet 33 of dielectric material. On the top surface of sheet 33 is "printed" striplike conductor 27 having a meandered or serpentine geometry. On the bottom surface of sheet 33 is "printed" striplike conductor 31 (shown in dashed lines) also having a meandered or serpentine geometry. The striplike conductors 27 and 31 although shown slightly offset are in opposed face-to-face relationship to provide the backward wave electromagnetic coupling. It should be noted that the amount of offset controls the coupling between the conductors.

While the transistors have been described in the common-emitter configuration it should be obvious that a common-base configuration could be used. In addition, while the couplers were described as quadrature couplers 180° couplers could be used by employing quadrature couplers in conjunction with 90° phase shifters.

There has thus been shown an improved signal amplifier which utilizes a slab of conductive material to simultaneously provide a substrate for the amplifier, a heat sink for the transistors, and one of the two required ground plane elements for the couplers. In addition, the use of couplers minimizes the danger of reflections from the inputs of the transistors being fed back to the input signal source. Furthermore, the utilization of a meandered geometry significantly improved the form factor of the coupler and permits its use at lower frequencies, such as the VHF band, than is normally practical for such devices.

I claim:

1. A balanced amplifier comprising: a slab of thermally and electrically conductive material, said slab being provided with at least two cavities, said slab having sufficient thermal capacity to act as a heat sink; at least two solid state signal amplifying devices, each of said signal-amplifying devices having a thermally conductive housing and at least two terminals, the housing of each of said signal-amplifying devices resting in one of said cavities, respectively, to be in thermal contact with said slab whereby heat generated by said signal-amplifying devices flows into said slab; at least two stripline couplers, each of said couplers comprising a sheet of insulating material disposed opposite said slab and parallel thereto, a pair of striplike conductors, each of said striplike conductors being printed on a different side of said sheet of said insulating material, said striplike conductors being electromagnetically coupled to each other, and an electrically conductive ground plane element disposed in a plane parallel to the plane of said slab, and spaced from the opposite and striplike conductor remote from said slab, the portion of said slab opposite the other striplike conductor providing the other ground plane element for the coupler; means for connecting one end of one striplike conductor of one of said couplers to one terminal of one of said signal-amplifying devices; means for connecting one end of the other striplike conductor of said one of said couplers to the same one terminal of the other signal-amplifying device; means for connecting one end of one striplike conductor of the other of said couplers to the other terminal of said one signal-amplifying device; and means for connecting one end of the other striplike conductor of the other of said couplers to the other terminal of said other signal-amplifying device; and other ends of the striplike conductors of said one coupler being adapted to receive an input signal, and the other ends of the striplike conductors of said other coupler being adapted to transmit an output signal.

2. The AC signal amplifier of claim 1 wherein each of said signal-amplifying devices has a third terminal which is connected to said slab.

3. The AC signal amplifier of claim 1 wherein each coupler is a 3 db. coupler.

4. The AC signal amplifier of claim 1 wherein each coupler is a quadrature coupler.

5. The AC signal amplifier of claim 1 wherein each of said striplike conductors of each of said couplers traces a meandered path in its associated plane, said meandered paths being opposite each other whereby the associated striplike conductors are in opposed substantially face-to-face relationship.

6. A balanced amplifier comprising: a slab of thermally and electrically conductive material, said slab having sufficient thermal capacity to act as a heat sink, said slab being provided with at least two cavities; at least two solid state signal amplifying devices, each of said signal-amplifying devices having a thermally conductive housing and at least two terminals, the housing of each of said signal-amplifying devices resting in one of said cavities, respectively, to be in thermal contact with said slab whereby heat generated by said signal-amplifying devices flows into said slab; at least two stripline couplers, each of said couplers comprising a pair of striplike conductors disposed in planes mutually spaced from each other and parallel to the plane of said slab, said striplike conductors having the same meandered path and being electromagnetically coupled to each other, and an electrically conductive ground plane element disposed in a plane parallel to the plane of said slab and spaced from and opposite the striplike conductor remote from said slab, the portion of said slab opposite the other striplike conductor providing the other ground plane element for the coupler; means for connecting one end of one striplike conductor of one of said couplers to one terminal of one of said signal amplifying devices; means for connecting one end of the other striplike conductor of said one of said couplers to the same one terminal of the other signal-amplifying device; means for connecting one end of one striplike conductor of the other of said couplers to the other terminal of said one signal-amplifying device; and means for connecting one end of the other striplike conductor of the other of said couplers to the other terminal of said other signal-amplifying device; the other ends of the striplike conductors of said one coupler being adapted to receive an input signal, and the other ends of the striplike conductors of said other coupler being adapted to transmit an output signal.